United States Patent
Hsu et al.

(10) Patent No.: US 9,137,913 B2
(45) Date of Patent: Sep. 15, 2015

(54) PORTABLE ELECTRONIC DEVICE AND CRADLE

(71) Applicants: Wei-Chih Hsu, Taipei (TW); Shi-Kuan Chen, Taipei (TW); Hong-Tien Wang, Taipei (TW); Yung-Hsiang Chen, Taipei (TW); Shih-Chin Gong, Taipei (TW); Yung-Ming Tien, Taipei (TW); Chun-Huang Yu, Taipei (TW); Chao-Tung Hsu, Taipei (TW); Jui-Che Hsu, Taipei (TW); Chih-Yin Lai, Taipei (TW); Chia-Sheng Liu, Taipei (TW)

(72) Inventors: Wei-Chih Hsu, Taipei (TW); Shi-Kuan Chen, Taipei (TW); Hong-Tien Wang, Taipei (TW); Yung-Hsiang Chen, Taipei (TW); Shih-Chin Gong, Taipei (TW); Yung-Ming Tien, Taipei (TW); Chun-Huang Yu, Taipei (TW); Chao-Tung Hsu, Taipei (TW); Jui-Che Hsu, Taipei (TW); Chih-Yin Lai, Taipei (TW); Chia-Sheng Liu, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 294 days.

(21) Appl. No.: 13/832,033

(22) Filed: Mar. 15, 2013

(65) Prior Publication Data

US 2013/0301201 A1 Nov. 14, 2013

Related U.S. Application Data

(60) Provisional application No. 61/645,597, filed on May 10, 2012.

(51) Int. Cl.
*H05K 5/02* (2006.01)
*F16M 11/00* (2006.01)
*G06F 1/16* (2006.01)

(52) U.S. Cl.
CPC ............. *H05K 5/0221* (2013.01); *F16M 11/00* (2013.01); *G06F 1/1632* (2013.01)

(58) Field of Classification Search
CPC ................................ H05K 5/02; F16M 11/00
USPC ............. 361/679.01–679.45, 679.55–679.61, 361/724–747, 752–759, 796–802, 361/805–837; 312/223.2, 7.1, 319.9, 333, 312/348.3, 222, 226; 248/309.1, 316.8, 248/917, 922, 923, 346.4; 455/575.1–575.5, 34, 7, 550.1, 90.3
See application file for complete search history.

(56) References Cited

U.S. PATENT DOCUMENTS

| | | | | |
|---|---|---|---|---|
| 5,933,321 | A | * | 8/1999 | Ruch et al. ............... 361/679.42 |
| 5,959,287 | A | * | 9/1999 | Myers et al. ............. 235/472.02 |
| 6,102,284 | A | * | 8/2000 | Myers et al. .................. 235/375 |

(Continued)

FOREIGN PATENT DOCUMENTS

| | | |
|---|---|---|
| TW | 242669 | 3/1995 |
| TW | M309133 | 4/2007 |

*Primary Examiner* — Courtney Smith
*Assistant Examiner* — Rashen E Morrison
(74) *Attorney, Agent, or Firm* — Jianq Chyun IP Office

(57) ABSTRACT

A portable electronic device adapted to be detachably connected to a cradle having a containing cavity is provided, wherein an inner wall of the containing cavity has a recess. The portable electronic device includes a body and a locking-and-releasing mechanism disposed in the body and including a driving unit and a latch. The driving unit is disposed in the body. The latch is connected to the driving unit and suitable for being driven by the driving unit to protrude out of the body or hide in the body. When the portable electronic device is disposed in the containing cavity, the driving unit drives the latch to protrude out of the body and be engaged with the recess. When the portable electronic device is going to be detached from the containing cavity, the driving unit drives the latch to be disengaged from the recess and move back in the body.

16 Claims, 5 Drawing Sheets

(56) References Cited

U.S. PATENT DOCUMENTS

| | | | |
|---|---|---|---|
| 6,151,218 A * | 11/2000 | Pirdy et al. | 361/727 |
| 6,175,491 B1 * | 1/2001 | Park | 361/679.57 |
| 6,366,458 B1 * | 4/2002 | Yoshida et al. | 361/679.41 |
| 6,716,058 B2 * | 4/2004 | Youn | 439/535 |
| 6,980,420 B2 * | 12/2005 | Maskatia et al. | 361/679.57 |
| 7,025,274 B2 * | 4/2006 | Solomon et al. | 235/472.01 |
| 7,052,296 B2 * | 5/2006 | Yang et al. | 439/165 |
| 7,130,188 B2 * | 10/2006 | Lee | 361/679.57 |
| 7,261,331 B2 * | 8/2007 | Lin | 292/116 |
| 8,120,716 B2 * | 2/2012 | Vitito | 348/837 |
| 8,208,249 B2 * | 6/2012 | Chin et al. | 361/679.27 |
| 8,315,048 B2 * | 11/2012 | Tarnoff | 361/679.43 |
| 8,320,961 B2 * | 11/2012 | Raffle et al. | 455/557 |
| 8,456,825 B2 * | 6/2013 | Miao et al. | 361/679.27 |
| 8,891,230 B1 * | 11/2014 | Jorgensen | 361/679.02 |
| 8,911,246 B2 * | 12/2014 | Carnevali | 439/170 |
| 2003/0090862 A1 * | 5/2003 | Hsiang | 361/681 |
| 2003/0221876 A1 * | 12/2003 | Doczy et al. | 178/18.01 |
| 2003/0223185 A1 * | 12/2003 | Doczy et al. | 361/680 |
| 2004/0246668 A1 * | 12/2004 | Maskatia et al. | 361/683 |
| 2004/0261421 A1 * | 12/2004 | McEuen et al. | 62/3.2 |
| 2005/0057894 A1 * | 3/2005 | Kim et al. | 361/683 |
| 2005/0168923 A1 * | 8/2005 | Huang et al. | 361/683 |
| 2006/0214433 A1 * | 9/2006 | Chang et al. | 292/128 |
| 2006/0256511 A1 * | 11/2006 | Ma | 361/680 |
| 2012/0066424 A1 * | 3/2012 | Gentil | 710/303 |
| 2013/0148298 A1 * | 6/2013 | Liu et al. | 361/695 |
| 2014/0098486 A1 * | 4/2014 | Davis | 361/679.41 |
| 2014/0187288 A1 * | 7/2014 | Correll, Jr. | 455/556.1 |

* cited by examiner

PORTABLE ELECTRONIC DEVICE AND CRADLE

CROSS-REFERENCE TO RELATED APPLICATION

This application claims the priority benefits of U.S. provisional application Ser. No. 61/645,597, filed on May 10, 2012. The entirety of the above-mentioned patent applications is hereby incorporated by reference herein and made a part of this specification.

BACKGROUND OF THE INVENTION

1. Field of the Invention

The present invention generally relates to a portable electronic device and a cradle. More particularly, the present invention relates to a portable electronic device and a cradle which are suitable for being detachably connected to each other.

2. Description of Related Art

Along with the development of technology, portable electronic devices, such as tablet personal computers (tablet PC) and electronic readers (E-Reader), are now in widespread use. Compared with traditional desktop PCs, the main advantage of the portable electronic device is in its user portability, as well as the convenience in computing provided to the user under different work environments. However, the portable electronic device is limited by its requirement for thinness and lightness, and thus its functionality and expandability cannot compare with desktop PCs having larger operating space. Accordingly, a cradle has been proposed in the conventional arts. The user can place the portable electronic device on the cradle, and a keyboard can be configured on the cradle. The user can thus employ the cradle to stand the portable electronic device, use the keyboard to operate the portable electronic device, and view the images displayed by the portable electronic device. Since the portable electronic device can be used like a desktop PC by employing the cradle, the value and convenience of the portable electronic device to the user are enhanced.

Accordingly, TW Patent No. M309133 filed by the Twinhead International Corporation provides an electronic device including a main body of a portable electronic device and a holder. The main body includes a hook mechanism including a switch and a hook. The holder includes a protrusion. If the main body is connecting to the holder, a user has to press the switch to drive the hook to hook the protrusion. If the main body is going to be detached from the holder, a user also has to presses the switch to drive the hook to release the protrusion.

With the conventional design describe above, the hook mechanism is exposed by the outer surface of the main body for the user to control the hook or release relationship between the main body and holder. Therefore, the hook mechanism may be worn off easily and accordingly the reliability may be reduced. In addition, the hook mechanism on the outer surface of the main body makes the appearance thereof unsatisfactory.

Moreover, after the main body is connected to the holder, the user is required to press the switch in order to lock the main body to the holder, and when the user removes the main body from the holder, the user is required to operate with both hands. That is, one hand releases a hook mechanism and ensures a hook relation between the main body and the holder does not return. At the same time, another hand grabs the main body to remove the main body from the holder. As such, it is inconvenient for the user to connect the main body to the holder and to remove the main body from the holder.

SUMMARY OF THE INVENTION

Accordingly, the present invention is directed to a portable electronic device, wherein the locking and releasing mechanism thereof is suitable for hiding in the body.

The present invention is directed to a cradle, which is capable of being detachably connected to a portable electronic device.

The present invention provides a portable electronic device adapted to be detachably connected to a cradle having a containing cavity, wherein an inner wall of the containing cavity has a recess. The portable electronic device includes a body and a locking and releasing mechanism. The locking and releasing mechanism disposed in the body includes a driving unit and a latch. The driving unit is disposed in the body. The latch is connected to the driving unit and suitable for being driven by the driving unit to protrude out of the body or hide in the body. When the portable electronic device is disposed in the containing cavity, the driving unit drives the latch to protrude out of the body and be engaged with the recess. When the portable electronic device is going to be detached from in the containing cavity, the driving unit drives the latch to be disengaged from the recess and move back in the body.

The present invention further provides a cradle adapted to be detachably connected to a portable electronic device including a body, a driving unit disposed in the body, and a latch disposed in the body and suitable for protruding out of the body. The cradle includes a base including a containing cavity for containing part of the portable electronic device. An inner wall of the containing cavity has a recess suitable for being engaged with the latch.

According to an embodiment of the present invention, the portable electronic device further includes a locking sensor disposed at the body. When the portable electronic device is disposed in the containing cavity, the locking sensor senses the cradle and generates a locking signal, and the driving unit drives the latch to protrude out of the body according to the locking signal.

According to an embodiment of the present invention, the body has a bottom surface and the locking sensor is disposed on the bottom surface.

According to an embodiment of the present invention, the driving unit includes a motor, a gear and a rack. The rack is fixed to the latch. The gear is connected to the motor and engaged with the rack. When the portable electronic device is disposed in the containing cavity, the motor actuates the gear to rotate, such that the gear drives the latch to protrude out of the body. When the portable electronic device is going to be detached from the containing cavity, the motor actuates the gear to rotate in an opposite direction, such that the gear drives the latch to move back in the body.

According to an embodiment of the present invention, the locking and releasing mechanism further includes a first stop sensor and a second stop sensor coupled to the driving unit and having a predetermined gap therebetween. The latch includes a stopper extended into the predetermined gap between the first stop sensor and the second stop sensor. When the latch is driven to protrude out of the body or hide in the body, the stopper contacts one of the first stop sensor and the second stop sensor and generates a stop signal, the driving unit stops driving the latch according to the stop signal.

According to an embodiment of the present invention, the latch includes a latch magnetic element. The driving unit includes a driving magnetic element and an electromagnetic element. The latch magnetic element is movably disposed between the driving magnetic element and the electromagnetic element. When the portable electronic device is disposed in the containing cavity, the driving magnetic element magnetically attracts the latch magnetic element to drive the latch moving toward the driving magnetic element and protruding out of the body. When the portable electronic device is going to be detached from in the containing cavity, the electromagnetic element is electrified, the magnetic attraction between the electromagnetic element and the latch magnetic element is greater than that between the driving magnetic element and the latch magnetic element, so as to drive the latch moving toward the electromagnetic element and back in the body.

According to an embodiment of the present invention, the portable electronic device further includes a first connector disposed at the body, wherein the cradle further includes a second connector. When the portable electronic device is disposed in the containing cavity, the first connector contacts and electronically connects to the second connector.

According to an embodiment of the present invention, the body has a bottom surface and the first connector is disposed on the bottom surface.

According to an embodiment of the present invention, the body has two side surfaces and a bottom surface connecting the two side surfaces. The latch is suitable for protruding from one of the side surfaces of the body.

According to an embodiment of the present invention, the portable electronic device is a tablet PC.

According to an embodiment of the present invention, the cradle further includes a releasing switch disposed at the base, wherein when the releasing switch is touched, the releasing switch generates a releasing signal, and the driving unit drives the latch to move back in the body according to the releasing signal.

According to an embodiment of the present invention, the portable electronic device further comprising a first connector, the cradle further comprising a driver and a second connector connected to the driver and suitable for being driven by the driver to protrude out of the containing cavity or hide in the containing cavity, when the portable electronic device is disposed in the containing cavity, the driver drives the second connector to protrude out of the containing cavity to be electronically connected to the first connector, the driver drives the second connector to move back in the base according to the releasing signal generated by the releasing switch, a locking sensor of the portable electronic device is notified that the second connector is going to be detached from the first connector, and when the locking sensor senses the separation of the first connector and the second connector, the locking sensor generates an unlocking signal to the driving unit so that the driving unit drives the latch to move back in the body.

According to an embodiment of the present invention, the portable electronic device further includes a first connector. The cradle further includes a driver and a second connector connected to the driver and suitable for being driven by the driver to protrude out of the containing cavity or hide in the containing cavity. When the portable electronic device is disposed in the containing cavity, the driver drives the second connector to protrude out of the containing cavity to be electronically connected to the first connector.

According to an embodiment of the present invention, the cradle further includes a keyboard unit pivotally connected to the base. The base is suitable for rotating relatively to the keyboard unit.

Based on the description above, the portable electronic device of the invention adopts the locking and releasing mechanism including the driving unit and the latch, wherein the locking and releasing mechanism is disposed in the body of the portable electronic device. Thereby, when the portable electronic device is connected to the cradle, the driving unit drives the latch to protrude out of the body and be engaged with the recess of the cradle. When the portable electronic device is going to be detached from the cradle, the driving unit drives the latch to be disengaged from the recess and move back in the body, so the portable electronic device can be separated from the cradle. Since the locking and releasing mechanism is hidden in the body, it does not affect the appearance of the portable electronic device. Moreover, the portable electronic device can be locked to or released from the cradle automatically by the locking and releasing mechanism, so the utilization convenience of the portable electronic device is increased.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
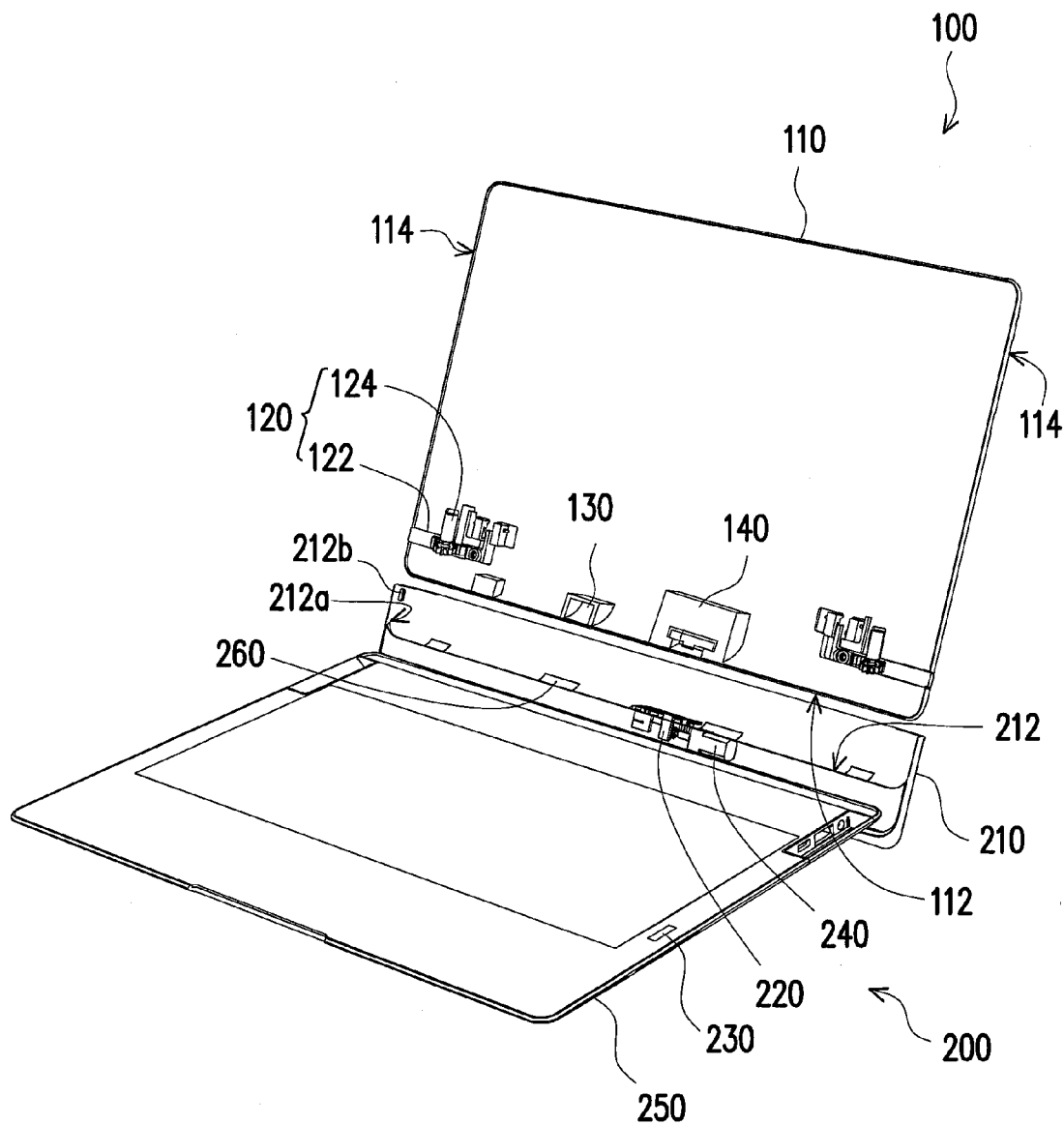
FIG. 1 illustrates an exploded view of an electronic device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 illustrates an exploded view of an electronic device according to an embodiment of the invention. Referring to FIG. 1, the electronic device 10 of the present embodiment includes a portable electronic device 100 and a cradle 200. It is noted that, the portable electronic device 100 and a cradle 200 in FIG. 1 are illustrated perspectively in order to show the inner components of the portable electronic device 100 and the cradle 200. The portable electronic device 100 is adapted to be detachably connected to the cradle 200. In the present embodiment, the portable electronic device 100 is, for example, a tablet PC. The cradle 200 has a containing cavity 212 for containing a part of the portable electronic device 100, such that a user can employ the cradle 200 to erect the portable electronic device 100, and use the peripheral devices such as keyboard installed on the cradle 200 to operate the portable electronic device 100.

In detail, the portable electronic device 100 as shown in FIG. 1 includes a body 110 and a locking and releasing mechanism 120. The locking and releasing mechanism 120 is disposed in the body 110 and includes a driving unit 122 and a latch 124. The driving unit 122 is disposed in the body 110.

The latch 124 is connected to the driving unit 122 and is suitable for being driven by the driving unit 122 to protrude out of the body 110 or hide in the body 110. In the present embodiment, the body 110 has two side surfaces 114 and a bottom surface 112 connecting the two side surfaces 114. The latch 124 is suitable for protruding from one of the side surfaces 114 of the body. The cradle 200 includes a base 210 having the containing cavity 212 for containing part of the portable electronic device 100. An inner wall 212a of the containing cavity 212 of the cradle 200 has a recess 212b suitable for being engaged with the latch 124. With the disposition described above, when the portable electronic device 100 is disposed in the containing cavity 212, the driving unit 122 drives the latch 124 to protrude out of the body 110 and be engaged with the recess 212b, so the portable electronic device 100 can be connected to the cradle 200. When the portable electronic device 100 is going to be detached from the containing cavity 212, the driving unit 122 drives the latch 124 to be disengaged from the recess 212b and move back in the body 110, so the portable electronic device 100 can be separated from the cradle 200.

In the present embodiment, the portable electronic device 100 further includes a first connector 140 disposed at the body 110, and the cradle 200 further includes a driver 240 and a second connector 220 connected to the driver 240. The second connector 220 is suitable for being driven by the driver 240 to protrude out of the containing cavity 212 or hide in the containing cavity 212. Thereby, when the portable electronic device 100 is disposed in the containing cavity 212, the driver 240 drives the second connector 220 to protrude out of the containing cavity 212 to contact and electronically connect to the first connector 140.

In addition, the portable electronic device 100 of the present embodiment further includes a locking sensor 130 disposed at the body 110. When the portable electronic device 100 is disposed in the containing cavity 212, the locking sensor 130 senses the cradle 200 and generates a locking signal, and the driving unit 122 drives the latch 124 to protrude out of the body 110 according to the locking signal. In detail, the locking sensor 130 is disposed on the bottom surface 112 of the body 110, so when the portable electronic device 100 is disposed in the containing cavity 212, the locking sensor 130 senses the contact of the cradle 200 and generates the locking signal. In other embodiment, the cradle may includes, for example, a magnet component 260, so when the portable electronic device 100 is disposed in the containing cavity 212, the locking sensor 130 senses the magnetism of magnet component 260 and generates the locking signal, and the driving unit 122 drives the latch 124 to protrude out of the body 110 according to the locking signal.

Moreover, the cradle 200 may further includes a releasing switch 230 coupled to the driving unit 122 and disposed at the base 210, for initiating the detachment of the electronic device 100 and the cradle 200. When the releasing switch 230 is activated, for example, touched by user, the releasing switch 230 generates a releasing signal, and the driving unit 122 drives the latch 124 to move back in the body 110 according to the releasing signal. In detail, after the releasing signal is generated, the driver 240 drives the second connector 220 to move back in the base 210, and the locking sensor 130 is notified that the second connector 220 is going to be detached from the first connector 140. When the locking sensor 130 senses the separation of the first connector 140 and the second connector 220, the locking sensor 130 then generates an unlocking signal to the driving unit 122 so that the driving unit 122 drives the latch 124 to move back in the body 110. In the present embodiment, the cradle 200 further includes a keyboard unit 250 pivotally connected to the base 210, so the base 210 is suitable for rotating relatively to the keyboard unit 250, and the releasing switch 230 is disposed at the keyboard unit 250 as shown in FIG. 1. However, the present embodiment is only for illustration. The present invention does not limit the location where the releasing switch 230 is disposed.

Figure 2:
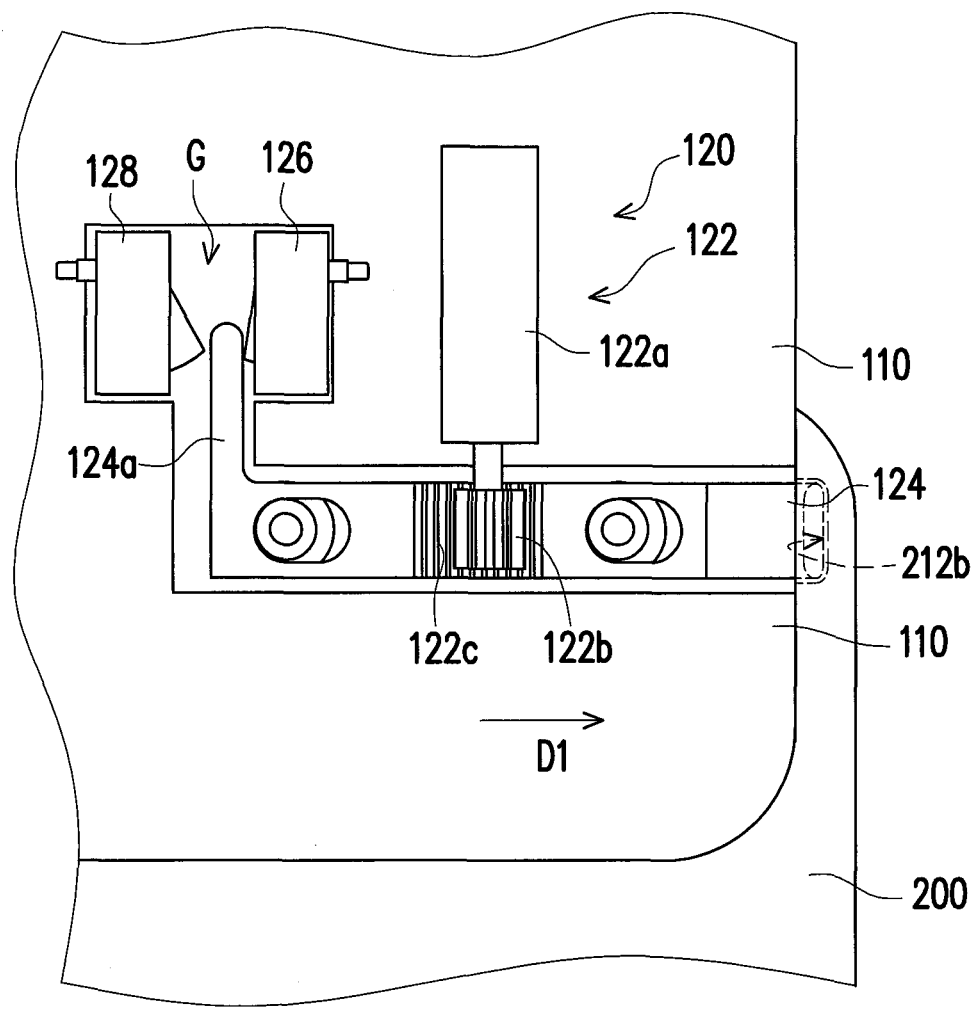
FIG. 2 illustrates a locking and releasing mechanism in a locking state according to an embodiment of the invention.

FIG. 2 illustrates a locking and releasing mechanism in a locking state according to an embodiment of the invention. Referring to FIG. 1 to FIG. 2, in the present embodiment, the driving unit 122 includes a motor 122a, a gear 122b and a rack 122c. The rack 122c is fixed to the latch 124. The gear 122b is connected to the motor 122a and engaged with the rack 122c. Thereby, when the portable electronic device 100 is disposed in the containing cavity 212, the locking sensor 130 as shown in FIG. 2 senses the cradle 200 and generates a locking signal. The motor 122a as shown in FIG. 2 then actuates the gear 122b to rotate according to the locking signal, such that the gear 122b drives the rack 122c to move along a locking direction D1, so as to drive the latch 124 to protrude out of the body 110. The locking and releasing mechanism 120 is then in a locking state to be engaged with the recess 212b of the cradle 200.

Figure 3:
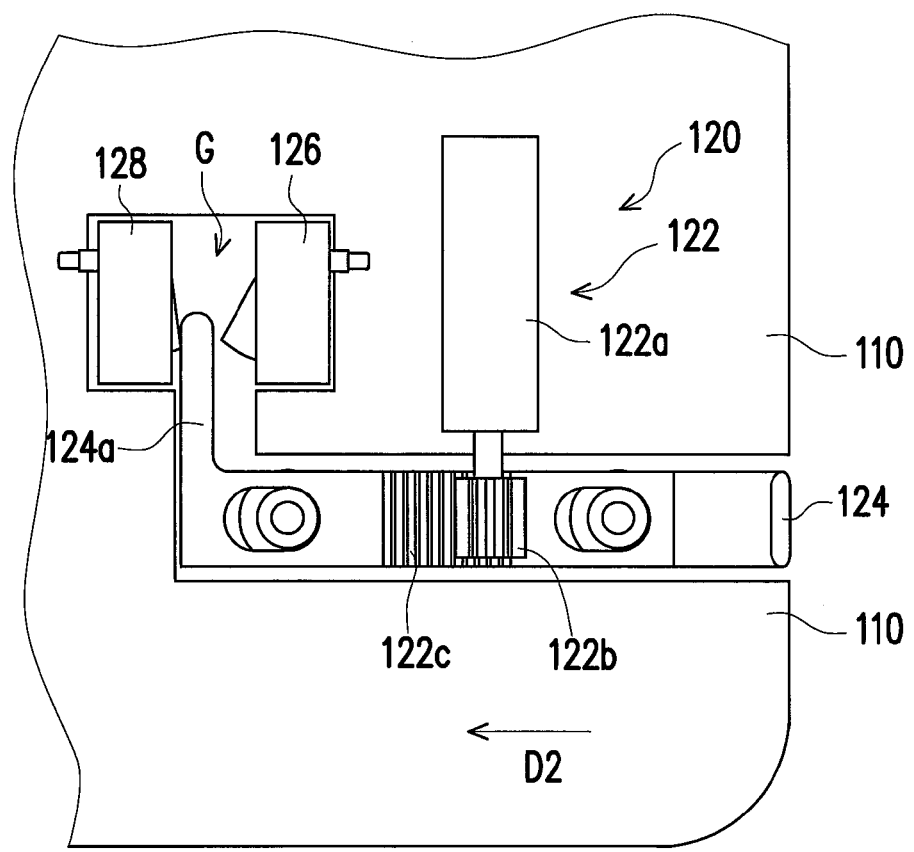
FIG. 3 illustrates the locking and releasing mechanism of FIG. 2 in a releasing state.
Figure 3:
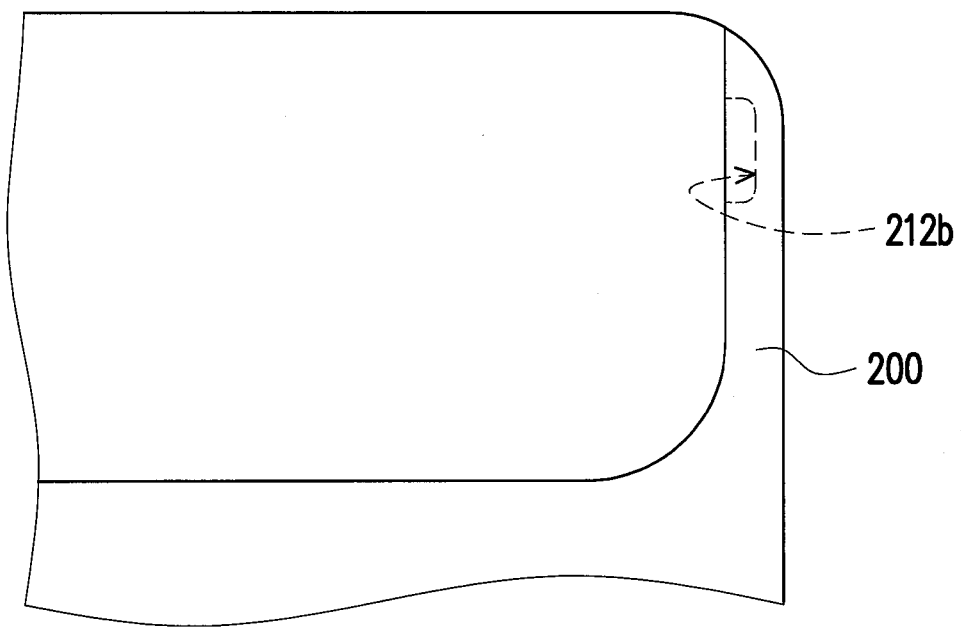

FIG. 3 illustrates the locking and releasing mechanism of FIG. 2 in a releasing state. Referring to FIG. 1 to FIG. 3, similarly, when the portable electronic device 100 is going to be detached from the containing cavity 212, the user may touch the releasing switch 230 as shown in FIG. 1, and the locking sensor 130 generates an unlocking signal. The motor 122a as shown in FIG. 2 then actuates the gear 122b to rotate in an opposite direction according to the unlocking signal, such that the gear 122b drives the rack 122c to move along a releasing direction D2 which is opposite to the locking direction D1, so as to drive the latch 124 to move back in the body 110. The locking and releasing mechanism 120 is then in a releasing state to be disengaged with the recess 212b of the cradle 200 as shown in FIG. 1, so the user may remove the portable electronic device from the cradle 200.

Referring to FIG. 2 and FIG. 3, in the present embodiment, the locking and releasing mechanism 120 further includes a first stop sensor 126 and a second stop sensor 128 coupled to the driving unit 122 and having a predetermined gap G therebetween, the latch 124 includes a stopper 124a extended into the predetermined gap G between the first stop sensor 126 and the second stop sensor 128. Thereby, when the latch 124 is driven to protrude out of the body 110 or hide in the body 110, the stopper 124a contacts either one of the first stop sensor 126 and the second stop sensor 128 and generates a stop signal, the driving unit 122 stops driving the latch 124 according to the stop signal. For example, when the latch 124 is driven to protrude out of the body 110 as shown in FIG. 2, the stopper 124a contacts the first stop sensor 126, so the first stop sensor 126 generates a stop signal. The driving unit 122 then stops driving the latch 124 to move according to the stop signal. When the latch 124 is driven to hide in the body as shown in FIG. 3, the stopper 124a contacts the second stop sensor 128, so the second stop sensor 128 generates a stop signal. The driving unit 122 then stops driving the latch 124 to move according to the stop signal.

Figure 4:
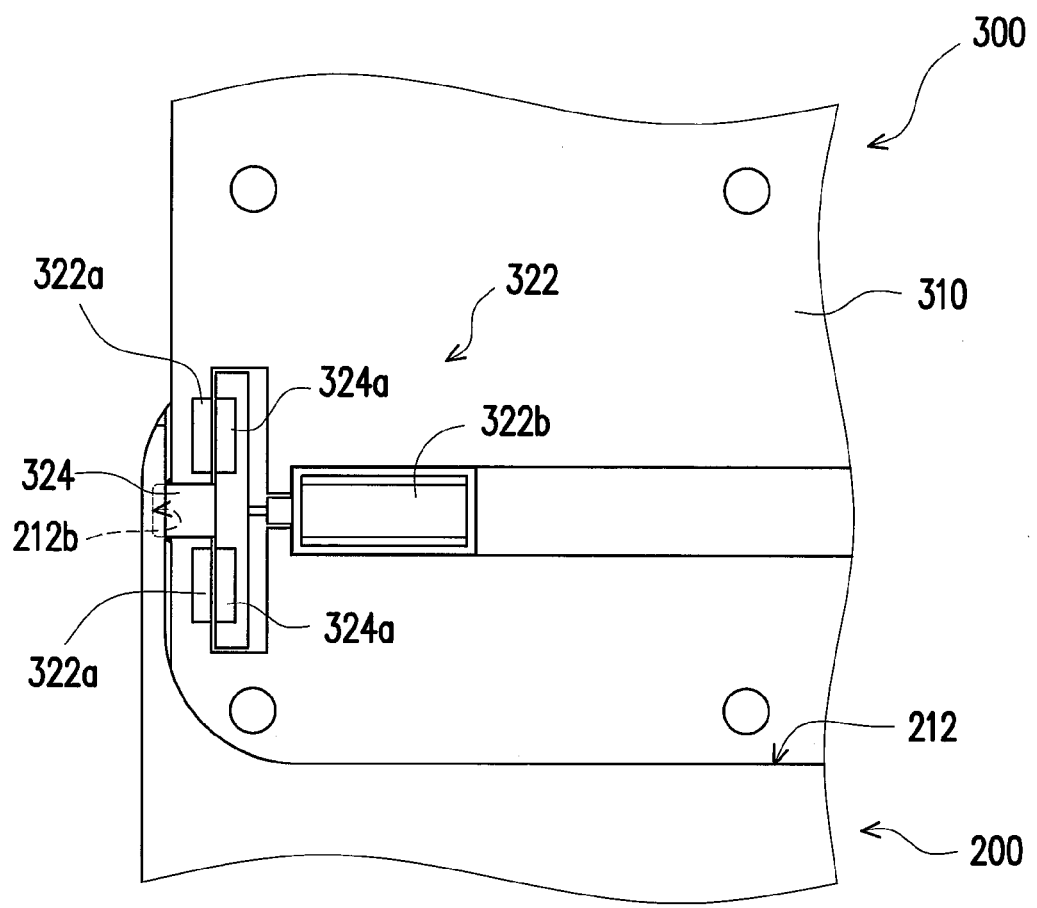
FIG. 4 illustrates a locking and releasing mechanism in a locking state according to another embodiment of the invention.

FIG. 4 illustrates a locking and releasing mechanism in a locking state according to another embodiment of the invention. Referring to FIG. 1 and FIG. 4, in the present embodiment, the portable electronic device 300 is similar to the portable electronic device 100 as shown in FIG. 1. The same or similar component numbers denote the same or similar components. The main differences between the portable electronic device 300 and the portable electronic device 100 fall in the locking and releasing mechanism 320, which will be described in detail below. In the present embodiment, the latch 324 as shown in FIG. 4 includes a latch magnetic element 324a. The driving unit 322 includes a driving magnetic element 322a and an electromagnetic element 322b. The latch magnetic element 324a is movably disposed between the driving magnetic element 322a and the electromagnetic element 322b. Thereby, when the portable electronic device 300 is disposed in the containing cavity 212 of the cradle 200, the driving magnetic element 322a magnetically attracts the latch magnetic element 324a to drive the latch 324 moving toward the driving magnetic element 322a and protruding out of the body 310. The locking and releasing mechanism 320 is then in a locking state to be engaged with the recess 212b of the cradle 200.

Figure 5:
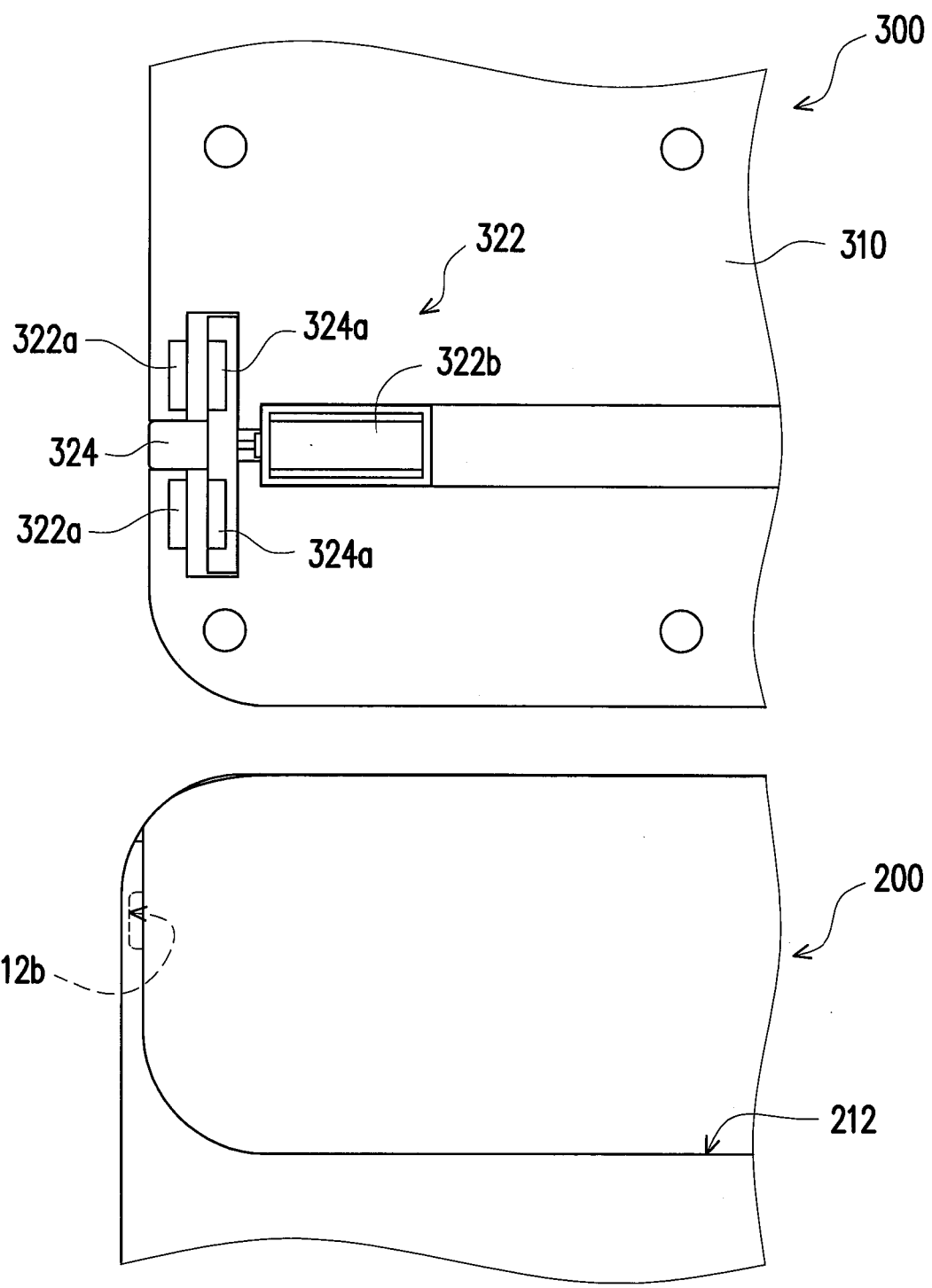
FIG. 5 illustrates a locking and releasing mechanism of FIG. 4 in a releasing state according to another embodiment of the invention.

Similarly, when the portable electronic device 300 is going to be detached from the containing cavity 212, the user may touch the releasing switch 230 as shown in FIG. 1, leading to the generation of unlocking signal by the locking sensor 130. The electromagnetic element 322b is then electrified, wherein the magnetic attraction between the electromagnetic element 322b and the latch magnetic element 324a is greater than the magnetic attraction between the driving magnetic element 322a and the latch magnetic element 324a. The electromagnetic element 322b then magnetically attracts the latch magnetic element 324a to drive the latch 324 moving toward the electromagnetic element 322b and back in the body 310 as shown in FIG. 5. The locking and releasing mechanism 320 is then in a releasing state to be disengaged with the recess 212b of the cradle 200, so the user may remove the portable electronic device 300 from the cradle 200.

In sum, the portable electronic device of the invention adopts the locking and releasing mechanism including the driving unit and the latch, wherein the locking and releasing mechanism is disposed in the body of the portable electronic device. Thereby, when the portable electronic device is connected to the cradle, the driving unit drives the latch to protrude out of the body and be engaged with the recess of the cradle. When the portable electronic device is going to be detached from in the cradle, the driving unit drives the latch to be disengaged from the recess and move back in the body, so the portable electronic device can be separated from the cradle. Since the locking and releasing mechanism is hidden in the body, it does not affect the appearance of the portable electronic device. Moreover, the portable electronic device can be locked to or released from the cradle automatically by the locking and releasing mechanism, so the utilization convenience of the portable electronic device is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A portable electronic device, adapted to be detachably connected to a cradle having a containing cavity, an inner wall of the containing cavity having a recess, the portable electronic device comprising:
   a body; and
   a locking and releasing mechanism, disposed in the body, comprising:
      a driving unit, disposed in the body; and
      a latch, connected to the driving unit and suitable for being driven by the driving unit to protrude out of the body or hide in the body;
   when the portable electronic device is disposed in the containing cavity, the driving unit drives the latch to protrude out of the body and be engaged with the recess, when the portable electronic device is going to be detached from the containing cavity, the driving unit drives the latch to be disengaged from the recess and move back in the body.

2. The portable electronic device as claimed in claim 1, further comprising:
   a locking sensor disposed at the body, when the portable electronic device is disposed in the containing cavity, the locking sensor senses the cradle and generates a locking signal, and the driving unit drives the latch to protrude out of the body according to the locking signal.

3. The portable electronic device as claimed in claim 2, wherein the body has a bottom surface and the locking sensor is disposed on the bottom surface.

4. The portable electronic device as claimed in claim 1, wherein the driving unit comprises a motor, a gear and a rack, the rack is fixed to the latch, the gear is connected to the motor and engaged with the rack, when the portable electronic device is disposed in the containing cavity, the motor actuates the gear to rotate, such that the gear drives the latch to protrude out of the body, when the portable electronic device is going to be detached from the containing cavity, the motor actuates the gear to rotate in an opposite direction, such that the gear drives the latch to move back in the body.

5. The portable electronic device as claimed in claim 4, wherein the locking and releasing mechanism further comprising a first stop sensor and a second stop sensor coupled to the driving unit and having a predetermined gap therebetween, the latch comprises a stopper extended into the predetermined gap between the first stop sensor and the second stop sensor, and when the latch is driven to protrude out of the body or hide in the body, the stopper contacts one of the first stop sensor and the second stop sensor and generates a stop signal, the driving unit stops driving the latch according to the stop signal.

6. The portable electronic device as claimed in claim 1, wherein the latch comprises a latch magnetic element, the driving unit comprises a driving magnetic element and an electromagnetic element, the latch magnetic element is movably disposed between the driving magnetic element and the electromagnetic element, when the portable electronic device is disposed in the containing cavity, the driving magnetic element magnetically attracts the latch magnetic element to drive the latch moving toward the driving magnetic element and protruding out of the body, when the portable electronic device is going to be detached from the containing cavity, the electromagnetic element is electrified, the magnetic attraction between the electromagnetic element and the latch magnetic element is greater than that between the driving magnetic element and the latch magnetic element, so as to drive the latch moving toward the electromagnetic element and back in the body.

7. The portable electronic device as claimed in claim 1, further comprising:
   a first connector disposed at the body, wherein the cradle further comprises a second connector, and when the portable electronic device is disposed in the containing cavity, the first connector contacts and electronically connects to the second connector.

8. The portable electronic device as claimed in claim 7, wherein the body has a bottom surface and the first connector is disposed on the bottom surface.

9. The portable electronic device as claimed in claim 1, wherein the body has two side surfaces and a bottom surface connecting the two side surfaces, the latch is suitable for protruding from one of the side surfaces of the body.

10. The portable electronic device as claimed in claim 9, wherein the latch is located at one of the side surfaces of the body.

11. The portable electronic device as claimed in claim 1 is a tablet PC.

12. The portable electronic device as claimed in claim 1, wherein the cradle comprises:
   a base, comprising the containing cavity for containing part of the portable electronic device, and the inner wall of the containing cavity having the recess suitable for being engaged with the latch.

13. The portable electronic device as claimed in claim 12, wherein the cradle further comprises:
   a releasing switch disposed at the base, wherein when the releasing switch is activated, the releasing switch generates a releasing signal, and the driving unit drives the latch to move back in the body according to the releasing signal.

14. The portable electronic device as claimed in claim 13, wherein the portable electronic device further comprising a first connector, the cradle further comprising a driver and a second connector connected to the driver and suitable for being driven by the driver to protrude out of the containing cavity or hide in the containing cavity, when the portable electronic device is disposed in the containing cavity, the driver drives the second connector to protrude out of the containing cavity to be electronically connected to the first connector, the driver drives the second connector to move back in the base according to the releasing signal generated by the releasing switch, a locking sensor of the portable electronic device is notified that the second connector is going to be detached from the first connector, and when the locking sensor senses the separation of the first connector and the second connector, the locking sensor generates an unlocking signal to the driving unit so that the driving unit drives the latch to move back in the body.

15. The portable electronic device as claimed in claim 12, wherein the portable electronic device further comprising a first connector, the cradle further comprising a driver and a second connector connected to the driver and suitable for being driven by the driver to protrude out of the containing cavity or hide in the containing cavity, and when the portable electronic device is disposed in the containing cavity, the driver drives the second connector to protrude out of the containing cavity to be electronically connected to the first connector.

16. The portable electronic device as claimed in claim 12, wherein the cradle further comprises:
   a keyboard unit, pivotally connected to the base, the base is suitable for rotating relatively to the keyboard unit.

* * * * *